United States Patent
Zhou

(10) Patent No.: US 9,449,869 B2
(45) Date of Patent: Sep. 20, 2016

(54) METHOD FOR FABRICATING INTERCONNECT STRUCTURE

(71) Applicant: Semiconductor Manufacturing International (Shanghai) Corporation, Shanghai (CN)

(72) Inventor: Ming Zhou, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 116 days.

(21) Appl. No.: 14/035,378

(22) Filed: Sep. 24, 2013

(65) Prior Publication Data

US 2014/0167283 A1  Jun. 19, 2014

(30) Foreign Application Priority Data

Dec. 17, 2012 (CN) .......................... 2012 1 0548617

(51) Int. Cl.

| | |
|---|---|
| H01L 21/4763 | (2006.01) |
| H01L 21/302 | (2006.01) |
| H01L 21/30 | (2006.01) |
| H01L 21/768 | (2006.01) |
| H01L 23/532 | (2006.01) |
| H01L 21/02 | (2006.01) |
| H01L 21/3105 | (2006.01) |
| H01L 21/311 | (2006.01) |

(52) U.S. Cl.
CPC ... *H01L 21/76802* (2013.01); *H01L 21/02126* (2013.01); *H01L 21/02362* (2013.01); *H01L 21/3105* (2013.01); *H01L 21/31144* (2013.01); *H01L 21/76826* (2013.01); *H01L 21/76829* (2013.01); *H01L 23/5329* (2013.01); *H01L 2924/0002* (2013.01)

(58) Field of Classification Search
CPC ................... H01L 21/76826; H01L 21/3105; H01L 21/76802; H01L 21/02126; H01L 21/76829; H01L 21/76843; H01L 21/02063; H01L 21/02203; H01L 21/0234; H01L 21/31144; H01L 21/02337; H01L 21/02359; H01L 21/02362; H01L 21/5329
USPC ........ 438/637, 706, 628, 778, 780, 781, 475
See application file for complete search history.

(56) References Cited

U.S. PATENT DOCUMENTS

| | | | |
|---|---|---|---|
| 6,566,283 B1 * | 5/2003 | Pangrle et al. | 438/788 |
| 6,657,304 B1 * | 12/2003 | Woo et al. | 257/758 |
| 6,972,252 B1 * | 12/2005 | Sanganeria et al. | 438/624 |
| 7,279,427 B2 | 10/2007 | Nishino et al. | |
| 8,535,767 B1 * | 9/2013 | Kimura | 427/553 |

(Continued)

*Primary Examiner* — Shouxiang Hu
(74) *Attorney, Agent, or Firm* — Anova Law Group, PLLC

(57) ABSTRACT

Various embodiments provide interconnect structures and fabrication methods. A carbon-containing dielectric layer can be formed on a substrate. A protective layer can be formed on the carbon-containing dielectric layer to prevent carbon loss from the carbon-containing dielectric layer by performing a surface treatment to the carbon-containing dielectric layer using a gas at least containing silicon and hydrogen. A hard mask layer can be formed on the protective layer. A through hole can be formed in the carbon-containing dielectric layer using the hard mask layer as a mask to expose a surface of the substrate for forming a contact plug in the through hole.

13 Claims, 4 Drawing Sheets

(56) References Cited

U.S. PATENT DOCUMENTS

2007/0048981 A1 3/2007 Bonilla et al.
2007/0238294 A1* 10/2007 Beyer et al. .................. 438/687
2009/0045164 A1* 2/2009 Farkas ..................... C09G 1/02
                                                        216/38
2009/0220895 A1* 9/2009 Garza ..................... H01L 22/12
                                                        430/322
2012/0178253 A1* 7/2012 Ahn ...................... C23C 16/401
                                                        438/643

* cited by examiner

METHOD FOR FABRICATING INTERCONNECT STRUCTURE

CROSS-REFERENCES TO RELATED APPLICATIONS

This application claims priority to Chinese Patent Application No. CN201210548617.8, filed on Dec. 17, 2012, the entire contents of which are incorporated herein by reference.

FIELD OF THE DISCLOSURE

The present disclosure relates to the field of semiconductor fabrication technology and, more particularly, relates to interconnect structures and fabrication methods.

BACKGROUND

One of the challenges in integrated circuits (ICs) design and fabrication is to reduce resistive capacitive (RC) delay in signal transmission. Conventional methods for reducing the RC delay include replacing aluminum metal layer with copper metal layer to reduce series resistance of the metal layer. Conventional methods also include reducing the parasitic capacitance between metal layers by forming porous low dielectric constant (low-K) materials or air gaps in the dielectric layer between the metal layers.

For example, FIG. 1 depicts formation of an interconnect structure using a conventional method. As shown, a substrate 5 is provided having semiconductor devices formed therein. A low-K dielectric layer 4 is formed on the substrate 5. A mask layer 6 is formed on the low-K dielectric layer 4. The low-K dielectric layer 4 is then patterned using the mask layer 6 as a mask to form a through hole. A metal material is then used to fill the through hole to form a contact plug connected with the semiconductor devices. However, during practical fabrication processes, an undercut often occurs between the mask layer and the low-K dielectric layer in the interconnect structure.

FIG. 2 depicts a conventional interconnect structure having an undercut. In the fabrication process of the interconnect structure, after a low-K dielectric layer 11 is patterned by a wet etching using a hard mask 12 as a mask, an undercut 13 is formed at the interface between the low-K dielectric layer 11 and the hard mask 12. In some cases, the size of the undercut 13 can reach about 5 nm. The existence of the undercut 13 may cause problems including the stripping of the hard mask 12. This affects the fabrication yield of interconnect structures and even affects the reliability of interconnect structures.

BRIEF SUMMARY OF THE DISCLOSURE

One aspect of the present disclosure includes a method for fabricating an interconnect structure. A carbon-containing dielectric layer can be formed on a substrate. A protective layer can be formed on the carbon-containing dielectric layer to prevent carbon loss from the carbon-containing dielectric layer by performing a surface treatment to the carbon-containing dielectric layer using a gas at least containing silicon and hydrogen. A hard mask layer can be formed on the protective layer. A through hole can be formed in the carbon-containing dielectric layer using the hard mask layer as a mask to expose a surface of the substrate for forming a contact plug in the through hole.

Another aspect of the present disclosure includes an interconnect structure. The interconnect structure can include a carbon-containing dielectric layer disposed on a substrate and a protective layer disposed on the carbon-containing dielectric layer to prevent carbon loss from the carbon-containing dielectric layer. The protective layer can be formed by a surface treatment to the carbon-containing dielectric layer using a gas at least containing silicon and hydrogen. A hard mask layer can be disposed on the protective layer. The carbon-containing dielectric layer can include a through hole using the hard mask layer as a mask and the through hole exposes a surface of the substrate for forming a contact plug in the through hole.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

During the fabrication process of interconnect structures, undercuts may be generated. For example, when forming a hard mask on a low-K dielectric layer, oxygen plasma is used to form the hard mask. Oxygen can react with carbon at the surface of the low-K dielectric layer to cause carbon loss from the surface of the low-K dielectric layer and to generate a film containing $SiO_2$ on the low-K dielectric layer. The active film containing $SiO_2$ has a high removal rate during wet etching. When patterning the low-K dielectric layer, undercuts may be generated due to excessive removal of the low-K dielectric layer.

As disclosed herein, a protective layer for preventing carbon loss from a dielectric layer can be formed on surface of the dielectric layer. Therefore, the removal rate of the dielectric layer at the surface can be the same as the removal rate of the bulk dielectric layer under the surface. The undercut problem during the patterning process of the dielectric layer can be reduced or prevented.

Figure 6:
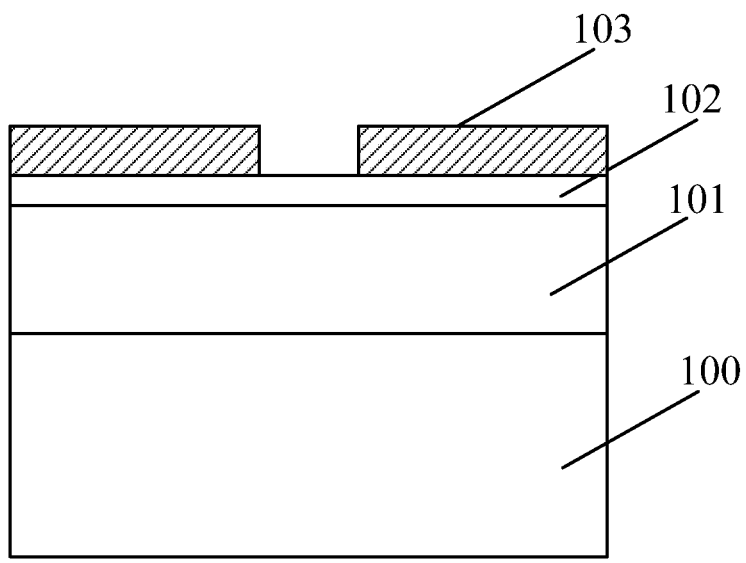
Figure 7:
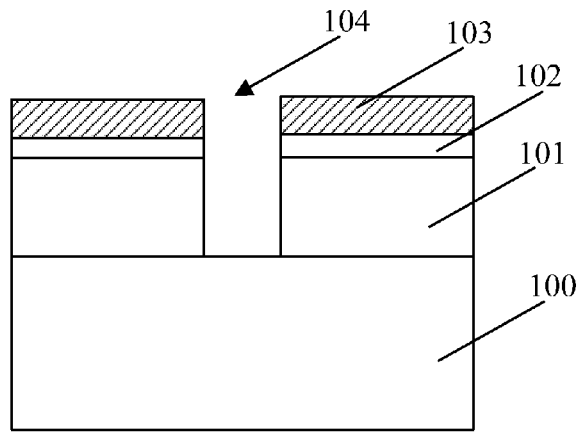
Figure 8:
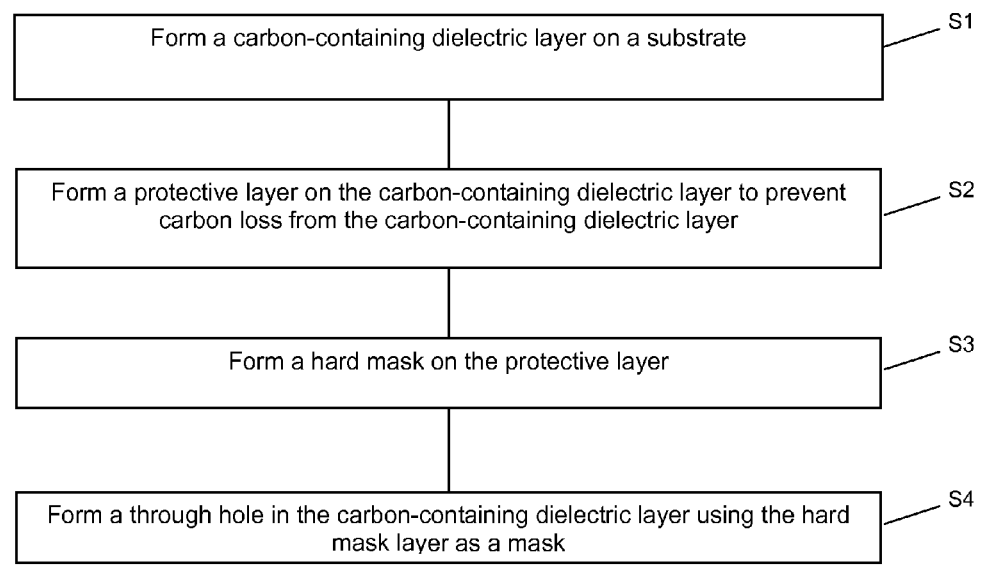
FIG. 8 depicts an exemplary method for forming an interconnect structure in accordance with various disclosed embodiments.

FIG. 8 depicts an exemplary interconnect structure, while FIGS. 3-7 depict cross-sectional views of corresponding interconnect structure at various stages during its formation during in accordance with various disclosed embodiments. Note that although FIGS. 3-7 depict semiconductor structures corresponding to the method depicted in FIG. 8, the semiconductor structures and the method are not limited to one another in any manner.

Figure 1:
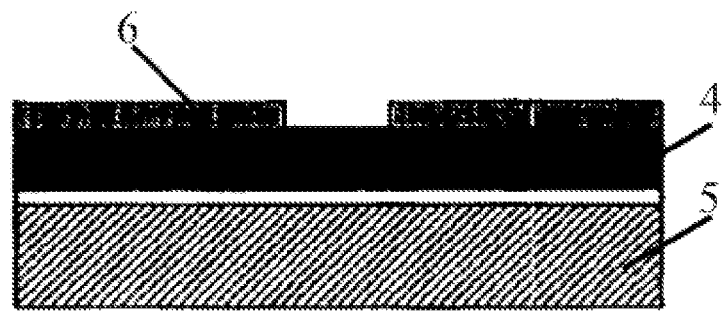
FIG. 1 depicts formation of an interconnect structure using a conventional method.
Figure 2:
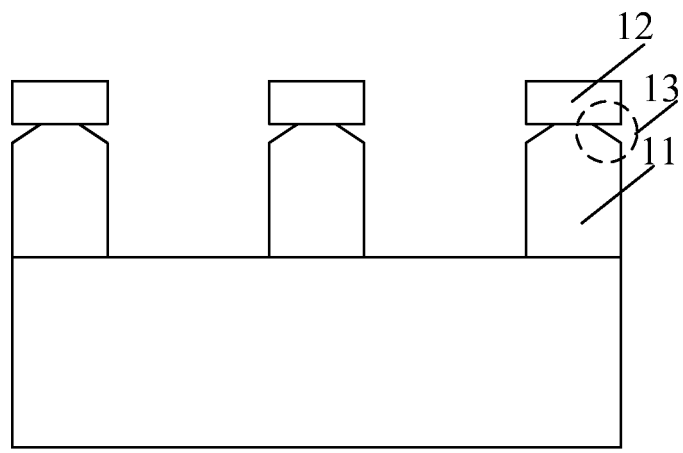
FIG. 2 depicts a conventional interconnect structure having an undercut.
Figure 3:
FIGS. 3-7 depict cross-sectional views of an exemplary interconnect structure at various stages during its formation in accordance with various disclosed embodiments.

In Step S1 of FIG. 8 and referring to FIG. 3, a substrate 100 is provided.

For example, the substrate 100 can include: a substrate layer having one or more semiconductor devices such as transistors formed therein (not shown), a metal layer formed on the substrate layer (not shown), and/or a barrier layer formed on the metal layer (not shown). The metal layer can be used to form an electrical connection with other devices through the interconnect structure that is formed by the method in accordance with various disclosed embodiments. The barrier layer can be used to prevent diffusion of metal material from the metal layer.

In one embodiment, the metal layer can be made of copper and/or aluminum, and the barrier layer can be made of a material containing nitrogen-doped silicon carbide (NDC). The material of the metal layer and the material of the barrier layer are not limited in any manner of the present disclosure.

Figure 4:
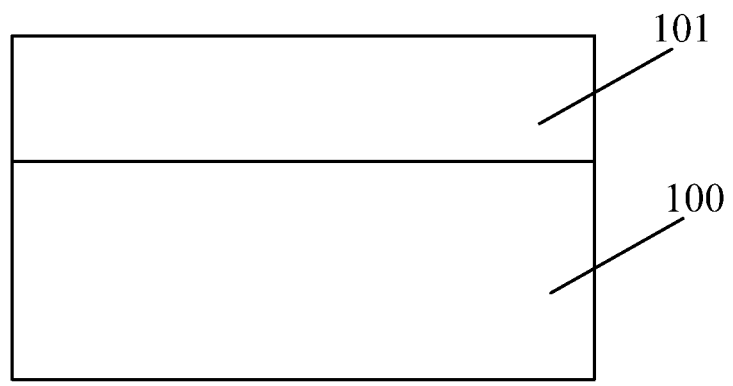

Still in Step S1 of FIG. 8 and referring to FIG. 4, a dielectric material is formed on the substrate 100 and treated by ultraviolet (UV) light, to form a carbon-containing low-K dielectric layer 101 (i.e., a dielectric layer having a low dielectric constant). As disclosed herein, the "carbon-containing low-K dielectric layer" means that the material of the low-K dielectric layer 101 at least contains carbon element.

The carbon-containing low-K dielectric layer disclosed herein is only used as an example, other dielectric layer(s) can be used and encompassed in the present disclosure. For example, other dielectric layers including, e.g., a carbon-containing ordinary dielectric layer, and/or a carbon-containing ultra-low-K dielectric layer, can be used to replace the carbon-containing low-K dielectric layer 101.

In some cases, the dielectric material formed on the substrate 100 can be selected according to the design specifications of the interconnect structure. In one embodiment, the dielectric material for forming a dielectric layer on the substrate 100 can be subject to a heat treatment using UV light, to form a porous dielectric layer. The porous dielectric layer can be one example of various types of the low-K dielectric layer 101. The material of the low-K dielectric layer 101 is not limited by the present disclosure. Specifically, the porous dielectric layer can be formed by diethoxymethylsilane and atom transfer radical polymerization to form a carbon-containing low-K dielectric layer. In some cases, the porous dielectric layer can be formed by a sol-gel method.

The dielectric material and the method of forming the dielectric material are not limited. For example, the dielectric material can include SiCOH, SiCO, SiCON, black diamond, or a combination thereof. In one example, the dielectric material can be deposited by chemical vapor deposition.

Figure 5:
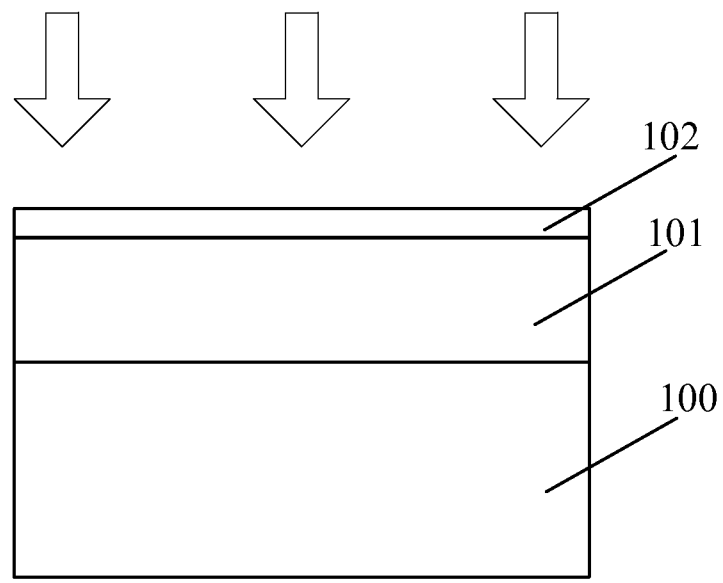

In Step S2 of FIG. 8 and referring to FIG. 5, a surface treatment is performed to the low-K dielectric layer 101 using silane, to form a protective layer 102 on the low-K dielectric layer 101 for preventing carbon loss. Specifically, the silane can provide silicon and hydrogen elements, and the low-K dielectric layer 101 can provide oxygen and carbon elements. The protective layer 102 can be a dense thin film containing C, H, O, and/or Si, and can be formed on the surface of the low-K dielectric layer 101.

In some embodiments, silane can be used as a gas for the surface treatment, although other gases for the surface treatment can be used without limitation. For example, other gases containing silicon and hydrogen can be used for the surface treatment to form the protective layer 102 of a dense thin film containing C, H, O, and/or Si. Various materials can be used to form the protective layer 102. In this manner, the protective layer 102 can be dense and can be used to protect the low-K dielectric layer 101 to reduce or eliminate carbon loss from the low-K dielectric layer 101.

The protective layer 102 can be used to prevent the carbon loss from the low-K dielectric layer 101, such that the surface of the low-K dielectric layer 101 cannot be easily removed or otherwise damaged in subsequent steps of patterning the low-K dielectric layer 101. The undercut problem at the surface of the low-K dielectric layer 101 can thus be prevented. Fabrication yield of interconnect structures can be improved.

In some cases where the silane concentration can be overly high, an excessive portion of the low-K dielectric layer 101 can react with silane, which may overly reduce the thickness of the low-K dielectric layer 101. In contrast, when the silane concentration is overly low, it can be difficult to form the protective layer 102. In various embodiments, silane and helium can be used in the surface treatment for treating the low-K dielectric layer 101 and helium can be used as a carrier gas.

For example, the surface treatment can use a silane concentration ranging from about 100 mg per cubic meter ($mg/m^3$) to about 300 $mg/m^3$; a helium flow rate ranging from about 2000 standard cubic centimeter per minute (sccm) to about 4000 sccm; a high-frequency power ranging from about 300 watts (W) to about 600 W; a low-frequency power ranging from about 150 W to about 250 W; and a chamber pressure ranging from about 3 torr to about 8 torr.

Other process conditions of the surface treatment can be used without limitation. For example, silane and argon can be used in the surface treatment to treat the low-K dielectric layer 101 and argon is used as a carrier gas. In this case, the surface treatment can use a silane concentration ranging from about 100 $mg/m^3$ to about 300 $mg/m^3$; an argon flow rate ranging from about 1000 sccm to about 2000 sccm; a high-frequency power ranging from about 300 W to about 600 W; a low-frequency power ranging from about 150 W to about 250 W; and a chamber pressure ranging from about 3 torr to about 8 torr.

In one embodiment, the surface of the dielectric material can be subject to a UV light treatment to form the low-K dielectric layer 101 that is porous (as depicted in Step S2 of FIG. 8). In one embodiment, the surface treatment using silane can be performed in-situ to the low-K dielectric layer 101 in the chamber for the UV light treatment.

With the surface treatment being performed in situ, the step of surface treatment can be well integrated with existing equipment. In addition, during the surface treatment, there is no need to move the to-be-formed interconnect structure from a vacuum chamber and into to another chamber. Thus, process steps can be reduced and the fabrication process can be simplified. However, the present disclosure does not limit this aspect of the method. For example, in other embodiments, the surface treatment using silane can be performed to the low-K dielectric layer 101 in a separate reaction chamber as a separate step, instead of being performed in situ in the chamber of the UV light treatment.

In Step S3 of FIG. 8 and referring to FIG. 6, a hard mask layer 103 is formed on the protective layer 102.

In one embodiment, the process for forming the hard mask layer 103 on the protective layer 102 can include: forming the hard mask layer 103 by a plasma-enhanced tetraethyl orthosilicate (PETEOS) deposition method. The material of the hard mask layer 103 can be silicon oxide. However, other suitable materials and methods for forming the hard mask layer 103 can also be encompassed without limitation.

During the process of forming the hard mask layer 103 by the exemplary PETEOS method, the plasma can be non-oxygen-containing plasma. That is, the hard mask layer 103 can be formed without using oxygen-containing plasma, which can further prevent a portion of the oxygen plasma from passing through the protective layer 102 and from reacting with the low-K dielectric layer 101 to cause the problem of carbon loss.

The hard mask layer 103 can be formed using a photolithographic method and an etching method, in order to expose the protective layer 102 at the position of a through hole which can be formed in subsequent steps.

In Step S4 of FIG. 8 and referring to FIG. 7, the low-K dielectric layer 101 is patterned using the hard mask layer 103 as a mask. For example, the patterning process can use a photolithography method and an etching method. A through hole 104 exposing the substrate 100 can be formed through the protective layer 102 and the low-K dielectric layer 101 by the patterning process.

Because the protective layer 102 protects the low-K dielectric layer 101, no excessive carbon loss can occur at the surface of the low-K dielectric layer 101. Therefore, in an etching process, the removal rate of the low-K dielectric layer 101 at the surface can be the same as the removal rate of the low-K dielectric layer 101 in the bulk (i.e., the non-surface portion of the low-K dielectric layer). In this manner, undercuts caused by excessive removal of the low-K dielectric layer 101 at the surface in contact with the hard mask layer 103 can be avoided. In addition, the problem of the hard mask layer 103 being easily stripped can be prevented, and the fabrication yield of interconnect structures can be improved.

In various embodiments, the etching method can include patterning with a wet etching process, for example, using diluted hydrofluoric acid. In another example, the etching method can include a dry etching, and/or wet etching using other solutions. As protected by the protective layer 102, the low-K dielectric layer 101 on the surface and in the bulk can have a same removal rate (or etching rate) during the etching process.

The through hole 104 can expose the metal layer (not illustrated) in the substrate 100. The method for fabricating the interconnect structure can further include: filling a metal material in the through hole 104 to form a contact plug. The contact plug can be used to establish an electrical connection between the metal layer in the substrate 100 and other devices.

In various embodiments, the method for fabricating the interconnect structure can further include other suitable steps such as a chemical mechanical polishing. The chemical mechanical polishing can be used to remove an excess amount of the metal material, and/or remove the hard mask layer 103 and the protective layer 102, to expose the low-K dielectric layer 101 and the contact plug.

The disclosed interconnect structures and methods for forming the interconnect structures can prevent occurrence of undercuts at the interface between a dielectric layer and a hard mask. As a result, the interface between the dielectric layer and the hard mask can be improved. And fabrication yield of interconnect structures can be improved. The electrical connection in the interconnect structure can be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for fabricating an interconnect structure, comprising:
   forming a carbon-containing dielectric layer on a substrate by treating a dielectric material on the substrate using ultraviolet (UV) light in a UV-treatment chamber, wherein the carbon-containing dielectric layer is made of a material consisting of SiCOH, SiCO, and SiCON;
   forming a protective layer on the carbon-containing dielectric layer to prevent carbon loss from the carbon-containing dielectric layer by in-situ performing, in the UV-treatment chamber, a surface treatment to the carbon-containing dielectric layer using a gas at least containing silicon and hydrogen;
   forming a hard mask layer on the protective layer using a non-oxygen plasma in a plasma-enhanced deposition to further prevent carbon in the carbon-containing dielectric layer from reacting with oxygen during the plasma-enhanced deposition; and
   forming a through hole in the carbon-containing dielectric layer using the hard mask layer as a mask to expose a surface of the substrate for forming a contact plug in the through hole.

2. The method of claim 1, wherein the carbon-containing dielectric layer is a low-K dielectric layer or an ultra-low-K dielectric layer.

3. The method of claim 1, wherein the carbon-containing dielectric layer is formed by a diethoxymethylsilane and atom transfer radical polymerization.

4. The method of claim 1, wherein the protective layer is made of a material including C, Si, H, O, or a combination thereof.

5. The method of claim 1, wherein the gas containing silicon and hydrogen includes silane.

6. The method of claim 5, wherein the performing of the surface treatment to the carbon-containing dielectric layer includes using silane and helium.

7. The method of claim 6, wherein the performing of the surface treatment using silane and helium includes:
   a silane concentration ranging from about 100 mg/m$^3$ to about 300 mg/m$^3$;
   a helium flow rate ranging from about 2000 sccm to about 4000 sccm;
   a high-frequency power ranging from about 300 W to about 600 W;
   a low-frequency power ranging from about 150 W to about 250 W; and
   a chamber pressure ranging from about 3 torr to about 8 torr.

8. The method of claim 5, wherein the performing of the surface treatment to the carbon-containing dielectric layer includes using silane and argon.

9. The method of claim 8, wherein the performing of the surface treatment using silane and argon includes:
   a silane concentration ranging from about 100 mg/m$^3$ to about 300 mg/m$^3$;
   an argon flow rate ranging from about 1000 sccm to about 2000 sccm;
   a high-frequency power ranging from about 300 W to about 600 W;
   a low-frequency power ranging from about 150 W to about 250 W; and
   a chamber pressure ranging from about 3 torr to about 8 torr.

10. The method of claim 1, wherein the plasma-enhanced deposition for forming the hard mask layer includes a plasma-enhanced tetraethyl orthosilicate (PETEOS) deposition.

11. The method of claim 1, wherein the hard mask layer is made of a material including silicon oxide.

12. The method of claim 1, wherein the forming of the through hole in the carbon-containing dielectric layer includes a wet etching using a diluted hydrofluoric acid.

13. The method of claim 1, wherein the carbon-containing dielectric layer is made of black diamond.

* * * * *